(12) United States Patent
Kim

(10) Patent No.: US 7,061,803 B2
(45) Date of Patent: Jun. 13, 2006

(54) METHOD AND DEVICE FOR PRESERVING WORD LINE PASS BIAS USING ROM IN NAND-TYPE FLASH MEMORY

(75) Inventor: Eui Suk Kim, Ichon-Shi (KR)

(73) Assignee: Hynix Semicondutor Inc., Kyungki-Do (KR)

( * ) Notice: Subject to any disclaimer, the term of this patent is extended or adjusted under 35 U.S.C. 154(b) by 63 days.

(21) Appl. No.: 10/886,867

(22) Filed: Jul. 8, 2004

(65) Prior Publication Data
US 2005/0078520 A1    Apr. 14, 2005

(30) Foreign Application Priority Data
Sep. 27, 2003    (KR) ...................... 10-2003-0067157

(51) Int. Cl.
*G11C 16/04*    (2006.01)

(52) U.S. Cl. ............ 365/185.17; 365/203; 365/185.33; 365/194

(58) Field of Classification Search ...................... None
See application file for complete search history.

(56) References Cited

U.S. PATENT DOCUMENTS 6,058,044 A * 5/2000 Sugiura et al. ........ 365/185.17

* cited by examiner

*Primary Examiner*—David Lam
(74) *Attorney, Agent, or Firm*—Marshall, Gerstein & Borun LLP

(57) ABSTRACT

The present invention discloses a method and device for preserving a word line pass bias using a ROM block in a NAND-type flash memory. The method for preserving the word line pass bias includes a step for closing a precharge transistor of a precharge circuit before the operation of a pass transistor for precharging a selected word line, by separately outputting from the ROM block a program precharge control signal transmitted to a group access signal generation circuit for outputting a group access signal and a program precharge control signal transmitted to a block word line, and synchronizing the signals in a synchronization circuit. Accordingly, time mismatching in the program and read operations of the NAND-type flash memory is prevented, and a predetermined voltage precharged to the selected block word line is precisely inputted to a specific cell and preserved.

12 Claims, 5 Drawing Sheets

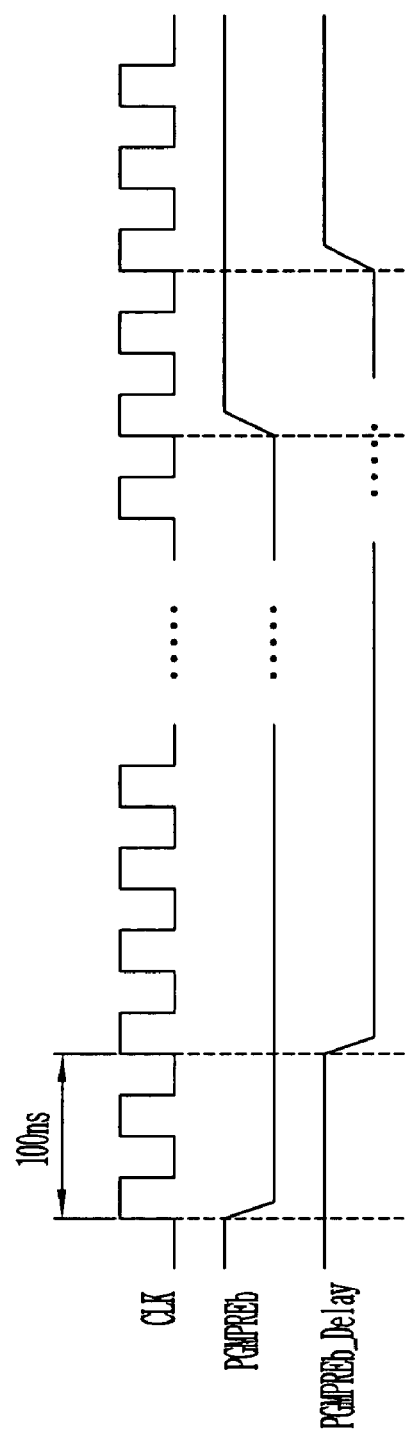

METHOD AND DEVICE FOR PRESERVING WORD LINE PASS BIAS USING ROM IN NAND-TYPE FLASH MEMORY

BACKGROUND

1. Field of the Invention

The present invention relates to a method and device for preserving a pass bias inputted to a word line during the read and program operations of a NAND-type flash memory.

2. Discussion of Related Art

In general, a flash memory is a semiconductor memory showing low power consumption and maintaining stored information even when power is off. That is, the flash memory is a non-volatile memory constantly supplied with power. Differently from the DRAM, the flash memory preserves the stored information when power is off, and easily inputs/outputs the information. Accordingly, the flash memory has been widely used for a digital TV, digital camcorder, digital camera, cellular phone, PDA, game machine, MP3 player, etc.

The flash memory is divided into a NAND-type flash memory having a large memory capacity and a NOR-type flash memory having a high processing speed. The NAND-type flash memory which attains high integration and has a replaceable hand disk is mostly used to store high integration voices or images. Here, the NAND-type flash memory includes a bit line operated as an I/O terminal, a string formed by connecting a plurality of memory cell transistors in series between the bit line and a ground line, and a memory cell array having a predetermined group of the string. A control voltage is supplied to a gate of the memory cell transistor. The operation of the NAND-type flash memory will now be explained.

Generally, the write or program operation of the NAND-type flash memory cell is performed by supplying 20V to a control gate and 0V to a P well. That is, the program operation of the NAND-type flash memory cell is performed by generating Fowler-Nordheim tunneling (F-N tunneling) between a floating gate and a semiconductor substrate, by grounding a source or drain region of the memory cell and a bulk region of the substrate, and supplying a positive high voltage (program voltage; Vpp, for example, 21V) to the control gate. In the F-N tunneling, electrons in the bulk region are accumulated in the floating gate by an electric field of the high voltage Vpp supplied to the control gate, thereby increasing a threshold voltage of the memory cell. Here, the electrons are injected from the front surface of a channel to the floating gate, and the threshold value of the memory cell is about 4 to 5V. In order to write '0' data, 0V is supplied to a drain voltage.

The read operation of the NAND-type flash memory cell is performed by precharging 5V to the drain, determining whether a cell current flows on the basis of a positive or negative value of the threshold voltage of the memory cell by setting the control gate in 0V, and reading '1' or '0' as a drain voltage value according to the determination result.

The erase operation of the NAND-type flash memory cell is performed by supplying 0V to the control gate and a high voltage of about 20V to the P well. As a result, an F-N tunneling current is generated in a gate oxide film, and the electrons flow from the floating gate to the silicon substrate. Here, the electrons are discharged from the floating gate to the front surface of the channel, and the threshold value of the memory cell becomes about −3. The F-N current is represented by the following formula:

$$J = AE^2 \exp(-B/E)$$

J denotes a current, E denotes an electric field, and A and B are constants. This current shows high electric field dependency and low temperature dependency.

As described above, the erase operation is simultaneously performed in sector units sharing the bulk region, by generating the F-N tunneling by supplying a very low voltage (for example, 0V) to the control gate and a high voltage (for example, 20V) to the bulk region. The F-N tunneling enables the flash memory cells to have about −2V of erase threshold voltage distribution, by discharging the electrons accumulated in the floating gate to the source region. The cell having an increased threshold voltage by the program operation seems to be off because the current is prevented from flowing from the drain region to the source region during the read operation. The cell having a decreased threshold voltage by the erase operation seems to be on because the current flows from the drain region to the source region.

The excess erase and excess program operations of the NAND-type flash memory cell result from that the F-N current is sensitive to the electric field in exponential function and that a program and erase speed has different values in each cell due to variations of a capacity coupling ratio, Vcc and temperature by process variables. As a result, threshold value distribution by the excessively-erased cell increases a string current, but threshold value distribution by the excessively-programmed cell sharply reduces the string current, to generate read fail in the whole string. Accordingly, it is very important to reduce the excess program operation in the NAND-type flash memory.

On the other hand, the string comprised of the flash memory cell is formed in block units. For example, the precharge operation of the NAND-type flash memory including 512 blocks is performed by precharging word lines of 64 blocks and discharging word lines of the other blocks. The word line precharge operation of each block is performed by a precharge circuit. The precharge circuit is controlled by a word line precharge control circuit, and the precharge control circuit is disposed in each memory block.

The conventional NAND-type flash memory precharges VPP potential to, for example, 64 block word lines according to the group access control signal, discharges the precharged voltage from the non-selected word lines, and performs the program or read operation on specific cells of the selected word lines.

However, the 64 block switching devices must be enabled or disabled according to the group access control signal, which increases a switching time. Therefore, the conventional NAND-type flash memory may not discharge the block word lines in a desired time, or may form a undesired current path from the selected word lines to the ground.

Namely, when the program precharge signal has a high level, the switching devices of the precharge circuit are closed by the group access control signal, only the selected word lines are opened by combinations of the block select addresses X-Address, and the other word lines are discharged through the discharge circuit. In the program precharge operation, the block word line side has gate loading to one word line in one block, but the group access signal side has loading in minimum 64 blocks. Accordingly, time mismatching occurs in the program or read operation of the flash memory by the precharge operation of the specific word line.

In the conventional art, the group access control signal is disabled late, and thus a pass bias of the selected word line is discharged. In order to solve unwanted time mismatching, the group access control signal can control only one block, which increases the group access signal generation circuit in each block. As a result, a chip size is seriously increased. In this case, if the program precharge signal inputted to the word line precharge circuit block is corrected by using a delay, the program precharge signal requires the delay time over 100 ns (read) or 500 ns (program). Therefore, a specific delay circuit is necessary to give the delay time, which also increases the chip size.

SUMMARY OF THE INVENTION

The present invention is directed to a method for preserving a word line pass bias in a NAND-type flash memory and a NAND-type flash memory using the same which can prevent time mismatching by obtaining effects of a delay circuit by using a ROM in a logic without adding the delay circuit, and which can efficiently supply a wanted bias to a selected word line and preserve the bias.

The present invention is also directed to a method for preserving a word line pass bias which can precisely detect electrical characteristics such as a cell voltage, by preserving the word line bias by solving general word line switching problems.

One aspect of the present invention is to provide a method for preserving a word line pass bias in a NAND-type flash memory, including the steps of: generating a program precharge signal and a program precharge delay signal delayed from the program precharge signal in a ROM block formed in a peripheral circuit coupled to a memory cell array of the NAND-type flash memory; synchronizing the program precharge signal and the program precharge delay signal with a program precharge signal for a block word line transmitted to the block word line and a program precharge signal for group access transmitted to a group access signal generation circuit, and separating the signals; turning on/off a precharge switch in a precharge circuit coupled to the block word line according to the program precharge signal for group access; when the precharge switch is turned on, precharging a high voltage to the block word line; turning on at least one of pass switches coupled to the block word line according to a block select address signal, for programming a cell coupled to the pass switch; turning on a discharge switch according to the program precharge signal for the block word line or the block select address signal; and when the discharge switch is turned on, discharging the high voltage precharged to the block word line.

Preferably, when the program precharge signal has a low level, the program precharge signal for the block word line is transited to a low level, and when the program precharge delay signal has a high level, the program precharge signal for the block word line is transited to a high level, and when the program precharge delay signal has a low level, the program precharge signal for group access is transited to a low level, and when the program precharge signal has a high level, the program precharge signal for group access is transited to a high level.

Preferably, the precharge switch, the pass switch and the discharge switch include NMOS transistors.

Preferably, the method for preserving the word line pass bias in the NAND-type flash memory includes a step for reading the cell by converting the program precharge signal and the program precharge delay signal into a read precharge signal and a read precharge delay signal, and the program precharge signal for group access and the program precharge signal for the block word line into a read precharge signal for group access and a read precharge signal for a block word line.

According to another aspect of the present invention, a NAND-type flash memory includes: a memory cell array having a plurality of flash memory cells for storing programmed data; a peripheral circuit being coupled to the memory cell array, and having a ROM block and a synchronization circuit; the synchronization circuit for synchronizing a program/read precharge signal generated in the ROM block and a program/read precharge delay signal obtained by delaying the program precharge/read precharge signal for a predetermined clock period with a program/read precharge signal for a block word line transmitted to the block word line and a program/read precharge signal for group access transmitted to a group access signal generation circuit, and separating the signals; a precharge circuit for precharging a high voltage to the block word line according to the program/read precharge signal for group access; a discharge circuit for discharging the high voltage from the block word line according to the program/read precharge signal for the block word line; a precharge control circuit coupled to the synchronous circuit, for transmitting a control signal to the precharge circuit and the discharge circuit, and receiving a block select address signal from an address buffer, the precharge control circuit including a separating switch for separating the operations of the precharge circuit and the discharge circuit; and a pass switch for passing the high voltage precharged to the block word line to the flash memory cell according to the block select address signal.

Preferably, when the program/read precharge signal has a low level, the program/read precharge signal for the block word line is transited to a low level, and when the program/read precharge delay signal has a high level, the program/read precharge signal for the block word line is transited to a high level, and when the program/read precharge delay signal has a low level, the program/read precharge signal for group access is transited to a low level, and when the program/read precharge signal has a high level, the program/read precharge signal for group access is transited to a high level.

Preferably, the ROM block stores information on a plurality of control signals for at least read and program modes, and transmits the control signals to corresponding control circuits, and the control signals include at least a program precharge signal, a program precharge delay signal, a read precharge signal and a read precharge delay signal.

Preferably, the synchronization circuit includes a NAND gate having a first input for the program/read precharge signal and a second input for the program/read precharge delay signal, a plurality of inverters having their inputs connected in series to the output of the NAND gate, a NOR gate having a first input for the program/read precharge signal and a second input for the program/read precharge delay signal, and an inverter having its input coupled to the output of the NOR gate, the first input and the second input are the program/read precharge signal and the program/read precharge delay signal, the output from the first to third inverters coupled to the NAND gate is the program/read precharge signal for the block word line, and the output from the fourth inverter coupled to the NOR gate is the program/read precharge signal for group access.

Preferably, the group access signal generation circuit includes: a high voltage switch having a first input for a first clock, a second input for a second clock, a third input for the program/read precharge signal for group access, a fourth input for the high voltage, and an output for the group access signal; a discharge NMOS transistor having its drain coupled to the output, its source grounded, and its control gate coupled to the third input; and a first inverter having its input coupled to the third input, and a second inverter having its input coupled to the output of the first inverter, and its output coupled to the control gate.

Preferably, the discharge circuit includes a discharge NMOS transistor having its drain coupled to the block word line, its source grounded, and its control gate coupled to the precharge control circuit.

Preferably, the precharge circuit includes a precharge NMOS transistor having its drain coupled to the high voltage, its source coupled to the block word line, and its control gate coupled to the output of the group access signal generation circuit, a second NMOS transistor having its control gate and source coupled to the block word line, and a first NMOS transistor having its control gate and source coupled to a drain of the second NMOS transistor, and its drain coupled to the high voltage.

Preferably, the precharge control circuit includes: the group access signal generation circuit; a first NAND gate having a first input for the program/read precharge signal for the block word line, a second input coupled to the second output of the second NAND gate for receiving the block select address signal, and a first output coupled to a source of a separating NMOS transistor for the separating switch; an inverter having its input coupled to the first output of the first NAND gate, and its output coupled to the control gate of the discharge NMOS transistor in the discharge circuit; and the separating NMOS transistor having its control gate connected to receive the precharge signal, its drain coupled to the block word line, and its source coupled to the first output of the first NAND gate.

BRIEF DESCRIPTION OF THE DRAWINGS

FIG. 3 is a timing diagram showing a program precharge signal and a program precharge delay signal generated in a ROM block of FIG. 1 by using a clock;

DETAILED DESCRIPTION OF PREFERRED EMBODIMENTS

A method and device for preserving a word line pass bias using a ROM in a NAND-type flash memory in accordance with a preferred embodiment of the present invention will now be described in detail with reference to the accompanying drawings.

Figure 1:
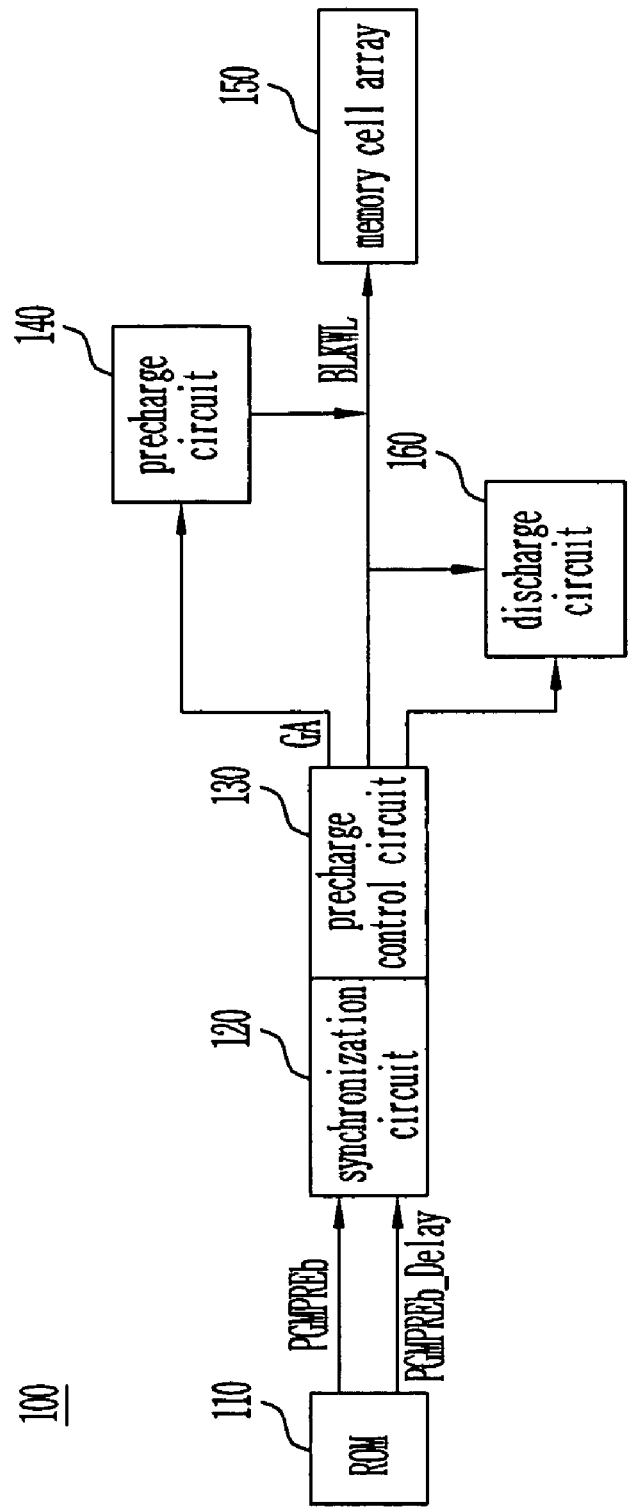
FIG. 1 is a block diagram illustrating a structure which a method for preserving a word line pass bias in a NAND-type flash memory can be applied to in accordance with a preferred embodiment of the present invention.

FIG. 1 is a block diagram illustrating a structure which the method for preserving the word line pass bias in the NAND-type flash memory can be applied to in accordance with the preferred embodiment of the present invention.

Referring to FIG. 1, a circuit 100 for preserving a word line pass bias includes a ROM block 110, a synchronization circuit 120, a precharge control circuit 130, a precharge circuit 140, a memory cell array 150, and a discharge circuit 160. The ROM block 110 is formed in a logic coupled to the memory cell array 150 of the NAND-type flash memory device, namely the ROM block is in a peripheral circuit. The ROM block 110 basically stores signals for various modes of the NAND-type flash memory such as read and program modes, so that the signals can be transmitted to corresponding control circuits in proper timing.

In accordance with the present invention, the ROM block 110 transmits at least a program precharge signal PGM-PREb, a program precharge delay signal PGMPREb_Delay, a read precharge signal READPREb (not shown) and a read precharge delay signal READPREb_Delay (not shown) to word line precharge control circuits. In addition, the program precharge delay signal PGMPREb_Delay and the read precharge delay signal READPREb_Delay are obtained by delaying the program precharge signal PGMPREb and the read precharge signal READPREb for a predetermined clock time, and have the same waveforms.

Figure 2:
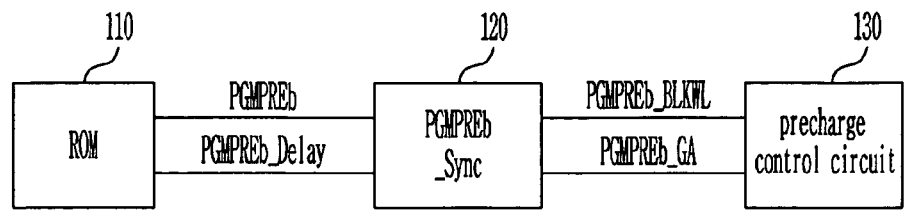
FIG. 2 is a block diagram illustrating signal flow between the ROM block of FIG. 1 and an X-DEC block.

FIG. 2 is a block diagram illustrating the signal flow between the ROM block 110 of FIG. 1 and the precharge control circuit 130 in an X-DEC block.

As illustrated in FIG. 2, the program precharge signal PGMPREb and the program precharge delay signal PGMPREb_Delay from the ROM block 110 are transmitted to a precharge control circuit 130 through the program precharge synchronization block 120. As one example of the synchronization circuit, the program precharge synchronization block 120 includes the circuit for synchronizing the program precharge signal PGMPREb and the program precharge delay signal PGMPREb_Delay with the program precharge signal for the block word line PGMPREb_BLKWL transmitted to the block word line and the program precharge signal for group access PGMPREb_GA transmitted to a group access signal generation circuit, and separating the signals.

FIG. 3 is a timing diagram showing a program precharge signal and a program precharge delay signal generated in a ROM block of FIG. 1 by using a clock.

For example, as shown in FIG. 3, when a clock period is 100 ns, the program precharge signal PGMPREb has been transited to a low level in the first rising edge of the clock, the program precharge delay signal PGMPREb_Delay is transited to a low level in the third rising edge of the clock. After a predetermined time elapses, the program precharge signal PGMPREb is transited to a high level in the $n^{th}$ rising edge of the clock, and the program precharge delay signal PGMPREb_Delay becomes a high level in $(n+2)^{th}$ rising edge of the clock. That is, in accordance with the present invention, 200 ns of delay is given to the word line precharge control circuit without using a delay chain, thereby overcoming time mismatching generated in the word line precharge operation of the NAND-type flash memory.

Figure 4:
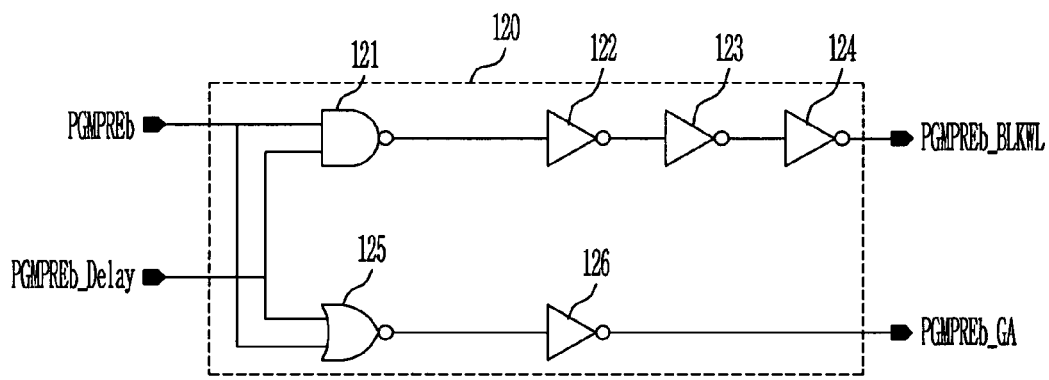
FIG. 4 is a circuit diagram illustrating a circuit for synchronizing the program precharge signal and the program precharge delay signal generated in the ROM block of FIG. 2 with a program precharge signal for a block word line and a program precharge signal for group access, and separating the signals.
Figure 5:
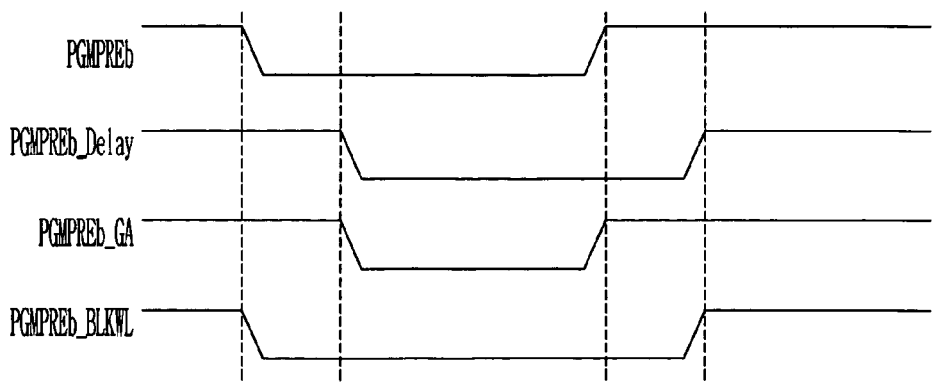
FIG. 5 is a timing diagram showing the four signals of FIG. 4.

FIG. 4 is a circuit diagram illustrating a circuit for synchronizing the program precharge signal PGMPREb and the program precharge delay signal PGMPREb_Delay generated in the ROM block of FIG. 2 with a program precharge signal for a block word line PGMPREb_BLKWL and a program precharge signal for group access PGMPREb_GA, and separating the signals. FIG. 5 is a timing diagram showing the four signals of FIG. 4.

In detail, as shown in FIG. 4, the program precharge synchronization block 120 includes a NAND gate 121 and a NOR gate 125 respectively receiving the program precharge signal PGMPREb and the program precharge delay signal PGMPREb_Delay. First to third inverters 122, 123 and 124 are coupled to the output of the NAND gate 121, and a fourth inverter 126 is coupled to the output of the NOR gate 125. The output from the inverter 124 coupled to the NAND gate 121 becomes the program precharge signal for the block word line PGMPREb_BLKWL, and the output from the inverter 126 coupled to the NOR gate 125 becomes the program precharge signal for group access PGMPREb_GA. As described above, the program precharge synchronization block 120 synchronizes and separates the two program precharge signals from the ROM block 110, and transmits the resulting signals to the block word line and the group access signal generation circuit.

The four signals will now be explained in detail.

Referring to FIG. 5, when the program precharge signal PGMPREb has a low level, the program precharge signal for the block word line PGMPREb_BLKWL is transited to a low level. Here, the program precharge signal for group access PGMPREb_GA still has a high level. When the program precharge delay signal PGMPREb_Delay has a low level, for example, after 200 ns, the program precharge signal for group access PGMPREb_GA is transited to a low level. The program precharge signal for group access PGMPREb_GA maintains a low level for the word line precharge time. When the precharge operation is finished, the program precharge signal PGMPREb is transited to a high level, and thus the program precharge signal for group access PGMPREb_GA is transited to a high level earlier than the program precharge signal for the block word line PGMPREb_BLKWL. When the program precharge delay signal PGMPREb_Delay is transited to a high level after a predetermined time, the program precharge signal for the block word line PGMPREb_BLKWL is also transited to a high level.

As described above, in accordance with the present invention, the program precharge signal PGMPREb and the program precharge delay signal PGMPREb_Delay generated in the ROM block 110 are synchronized and separated in the program precharge synchronization block 120, and transmitted to the X-DEC block including the precharge control circuit 130. Thereafter, a predetermined word line group including a plurality of memory cells is appropriately opened and closed according to a group access control signal. In the conventional art, when the word line bias is supplied to the selected word line, a precharge time for opening a word line pass transistor is required. However, in accordance with the present invention, when the word line bias is supplied to the selected word line, the pass bias is precharged to the whole word lines of one block and maintained only in the word lines coded by the X-address, and the other word lines are discharged. As a result, time mismatching generated when the bias is supplied to the word line is efficiently prevented.

Figure 6:
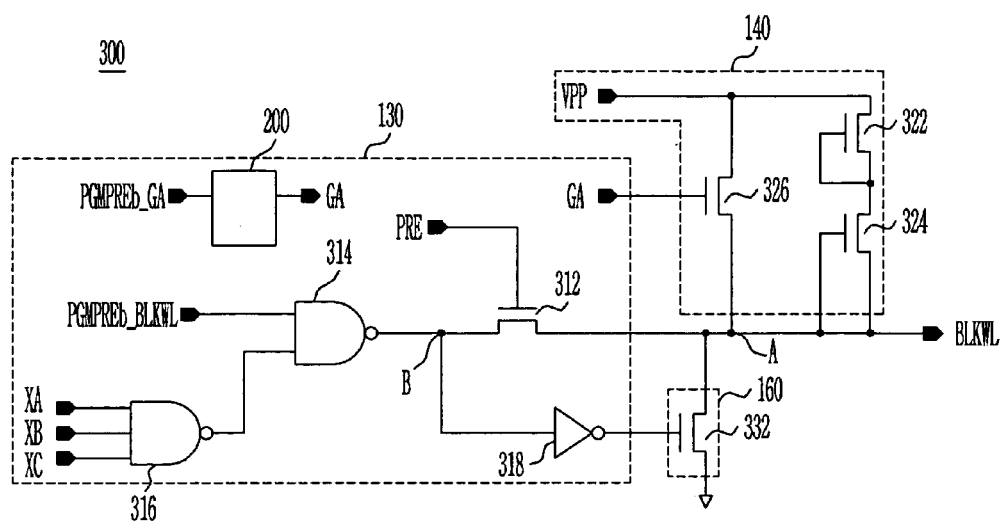
FIG. 6 is a circuit diagram illustrating an application example of the method for preserving the word line pass bias in the NAND-type flash memory in accordance with the preferred embodiment of the present invention.

FIG. 6 is a circuit diagram illustrating an application example of the method for preserving the word line pass bias in the NAND-type flash memory in accordance with the preferred embodiment of the present invention.

Referring to FIG. 6, the word line precharge circuit block 300 of the NAND-type flash memory includes a precharge control circuit 130, a precharge circuit 140 and a discharge circuit 160. The word line precharge operation will now be explained in detail.

The precharge circuit 140 includes first and second NMOS transistors 322 and 324, and a precharge NMOS transistor 326. The first and second NMOS transistors 322 and 324 are connected in series between a power supply VPP and the block word line BLKWL to be operated as a diode, and also conductively coupled to precharge the block word line BLKWL in a predetermined potential in the precharge mode.

Figure 7:
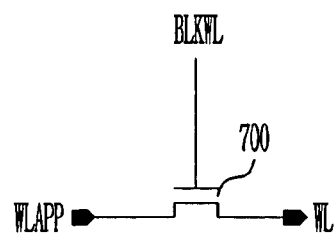
FIG. 7 is a circuit diagram illustrating a circuit for supplying a bias to a specific word line coupled to a block word line of FIG. 6.

The precharge operation of the precharge circuit 140 is started when the precharge NMOS transistor 326 is turned on according to a group access signal GA from the precharge control circuit 130. Here, the group access signal is mentioned as a control signal for specific group A. When the precharge NMOS transistor 326 is turned on, the second NMOS transistor 324 and the first NMOS transistor 322 are sequentially turned on, for supplying a high voltage VPP to the block word line BLKWL. Thereafter, when the group access GA is high, namely when the precharge NMOS transistor 326 is turned on, the block word line BLKWL is precharged to have a potential of VPP-Vth. The precharge circuit 140 for precharging the word lines of the memory block is enabled by the potential. In order to precisely transmit a word line bias WLAPP to the memory cell without loss during the program and read operations of the NAND-type flash memory, as shown in FIG. 7, the word line bias WLAPP obtained by adding a word line reference bias to an NMOS threshold voltage Vth is supplied to a high voltage pass NMOS transistor 700 of the NAND-type flash memory. The cell is programmed by the above process. The read operation of the cell is identical to the program operation except for level differences of the high voltage VPP.

The discharge circuit 160 includes a discharge NMOS transistor 332 coupled to the block word line BLKWL. The discharge NMOS transistor 332 has its drain coupled to the block word line BLKWL, its control gate coupled to the precharge control circuit 130, and its source coupled to a ground.

The precharge control circuit 130 includes a group access signal generation circuit 200, a separating NMOS transistor 312, a first NAND gate 314, a second NAND gate 316 and an inverter 318. Here, the group access signal generation circuit 200 can be individually formed from the precharge control circuit 130. The separating NMOS transistor 312 is turned on or off according to a precharge control signal PRE inputted to its control gate. The first NAND gate 314 receives a program precharge signal for the block word line PGMPREb_BLKWL. Accordingly, when the first NAND gate 314 receives a low level program precharge signal for a block word line PGMPREb_BLKWL, it outputs a high level signal. The high level output signal from the first NAND gate 314 is inputted to the control gate of the discharge NMOS transistor 332 of the discharge circuit 160 through the inverter 318, so that the discharge NMOS transistor 332 can maintain an off state. The second NAND gate 316 receives XA, XB and XC of block select addresses X-Address, and has its output coupled to the input of the first NAND gate 314.

Figure 8:
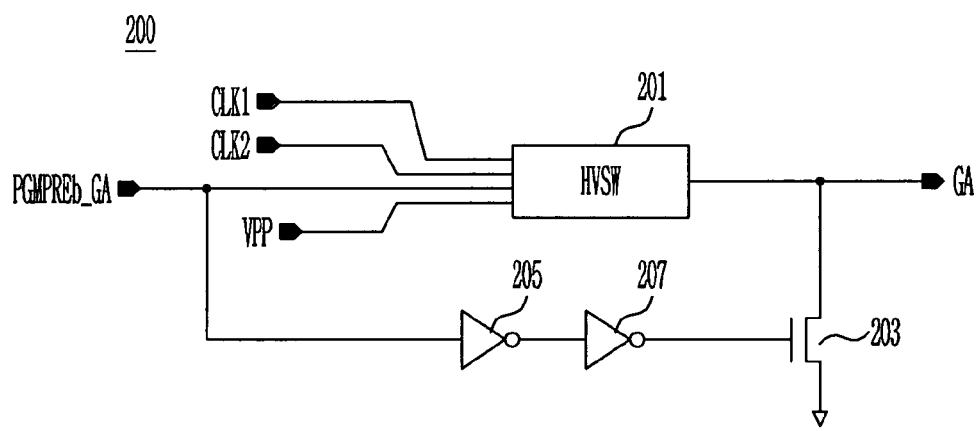
FIG. 8 is a circuit diagram illustrating a group access signal generation circuit for driving a precharge circuit of FIG. 6.

As illustrated in FIG. 8, the group access signal generation circuit 200 includes a high voltage switch 201 synchronized with a first or second clock, for controlling output of the high voltage VPP according to a low or high level of the program precharge signal for group access PGMPREb_GA. For example, the high voltage switch 201 outputs a high voltage control signal for precharging about 15 to 20V to the word line in the program operation and about 5V to the word line in the read or write operation. The group access signal generation circuit 200 includes a plurality of inverters 205 and 207 having their inputs coupled to the input of the high voltage switch 201 for the program precharge signal for group access PGMPREb_GA, and their outputs coupled to a control gate of a discharge NMOS transistor 203 in order to restrict output of the high voltage VPP for the control signal. The plurality of inverters 205 and 207 properly amplify the program precharge signal for group access PGMPREb_GA and transmit it to the control gate of the discharge NMOS transistor 203. The discharge NMOS transistor 205 has its drain coupled to the output of the high voltage switch 201 and its source grounded. Here, the discharge NMOS transistor 203 discharges the high voltage VPP from the high voltage switch 201 according to a specific level of the program precharge signal for group access PGMPREb_GA.

The discharge operation of the block word line will now be explained.

Still referring to FIG. 6, after the program precharge signal for group access PGMPREb_GA is transited from a low level to high level, when the program precharge signal for the block word line PGMPREb_BLKWL is transited from a low to high level, the precharge signal PRE is transited from a high to low level, so that the precharge NMOS transistor 326 is turned off. When the program precharge signal for the block word line PGMPREb_BLKWL has a high level, the output from the first NAND gate 314 is changed according to the block select address signals XA, XB and XC. In the case of the non-selected word line, at least one of the block select address signals XA, XB and XC has a low level, and thus the output from the second NAND gate 316 has a high level. The program precharge signal for the block word line PGMPREb_BLKWL and the output from the second NAND gate 316 have a high level, and thus the output from the first NAND gate 314 has a low level. The low level output signal from the first NAND gate 314 is inputted to the control gate of the discharge NMOS transistor 332 through the inverter 318. Here, the discharge NMOS transistor 332 of the non-selected word line is turned on. When the discharge NMOS transistor 332 is turned on, the voltage precharged to the block word line BLKWL is discharged to the ground.

Since the X-DEC of the invention includes a word line pass bias control circuit for separating the program precharge signal into two signals, and transmitting the two signals to open the discharge circuit 160 when the pass transistor of the selected word line is completely closed. Accordingly, time mismatching does not occur when the word line pass bias is supplied. For example, still referring to FIGS. 6 and 7, the high voltage of the selected word line is discharged to node A because the discharge NMOS transistor 332 is opened before the pass NMOS transistor 700 is closed, which is overcome in the present invention.

In the above embodiment, the program operation of the NAND-type flash memory has been described. However, the program and read operations are substantially identical to each other except for bias level differences. Accordingly, it is apparent that the present invention can be applied to the read operation of the NAND-type flash memory in the same manner.

As described above, in accordance with the present invention, the pass bias of the selected word line is prevented from being discharged due to time mismatching between the group access control circuit and the X-DEC by loading.

Moreover, the delay is supplied to the word line bias without using the large-sized delay chain, thereby removing time mismatching.

In addition, a chip number per wafer can be increased by restricting the chip size, which is economically advantageous.

Furthermore, the electrical characteristics such as a cell voltage can be precisely detected by preserving the word line bias by overcoming general word line switching problems.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A method for preserving a word line pass bias in a NAND-type flash memory, comprising the steps of:
generating a program precharge signal and a program precharge delay signal delayed from the program precharge signal in a ROM block formed in a peripheral circuit coupled to a memory cell array of the NAND-type flash memory;
synchronizing the program precharge signal and the program precharge delay signal with a program precharge signal for a block word line transmitted to the block word line and a program precharge signal for group access transmitted to a group access signal generation circuit, and separating the signals;
turning on/off a precharge switch in a precharge circuit coupled to the block word line according to the program precharge signal for group access;
precharging a high voltage to the block word line when the precharge switch is turned on;
turning on at least one of pass switches coupled to the block word line according to a block select address signal, for programming a cell coupled to the pass switch;
turning on a discharge switch according to the program precharge signal for the block word line or the block select address signal; and
when the discharge switch is turned on, discharging the high voltage precharged to the block word line.

2. The method of claim 1, wherein, when the program precharge signal has a low level, the program precharge signal for the block word line is transited to a low level, and when the program precharge delay signal has a high level, the program precharge signal for the block word line is transited to a high level, and when the program precharge delay signal has a low level, the program precharge signal for group access is transited to a low level, and when the program precharge signal has a high level, the program precharge signal for group access is transited to a high level.

3. The method of claim 1, wherein the precharge switch, the pass switch and the discharge switch include NMOS transistors.

4. The method of claim 1, including a step for reading the cell by converting the program precharge signal and the program precharge delay signal into a read precharge signal and a read precharge delay signal, and the program precharge signal for group access and the program precharge signal for the block word line into a read precharge signal for group access and a read precharge signal for a block word line.

5. A NAND-type flash memory, comprising:
a memory cell array having a plurality of flash memory cells for storing programmed data;
a peripheral circuit being coupled to the memory cell array, and having a ROM block and a synchronization circuit;
the synchronization circuit for synchronizing a program/read precharge signal generated in the ROM block and a program/read precharge delay signal obtained by delaying the program precharge/read precharge signal for a predetermined clock period with a program/read precharge signal for a block word line transmitted to the block word line and a program/read precharge signal for group access transmitted to a group access signal generation circuit, and separating the signals;
a precharge circuit for precharging a high voltage to the block word line according to the program/read precharge signal for group access;
a discharge circuit for discharging the high voltage from the block word line according to the program/read precharge signal for the block word line;
a precharge control circuit coupled to the synchronous circuit, for transmitting a control signal to the precharge circuit and the discharge circuit, and receiving a block select address signal from an address buffer, the precharge control circuit including a separating switch for separating the operations of the precharge circuit and the discharge circuit; and
a pass switch for passing the high voltage precharged to the block word line to the flash memory cell according to the block select address signal.

6. The memory of claim 5, wherein, when the program/read precharge signal has a low level, the program/read precharge signal for the block word line is transited to a low level, and when the program/read precharge delay signal has a high level, the program/read precharge signal for the block word line is transited to a high level, and when the program/read precharge delay signal has a low level, the program/read precharge signal for group access is transited to a low level, and when the program/read precharge signal has a high level, the program/read precharge signal for group access is transited to a high level.

7. The memory of claim 5, wherein the ROM block stores information on a plurality of control signals for at least read and program modes, and transmits the control signals to corresponding control circuits,
wherein the control signals comprise at least a program precharge signal, a program precharge delay signal, a read precharge signal and a read precharge delay signal.

8. The memory of claim 5, wherein the synchronization circuit comprises a NAND gate having a first input for the program/read precharge signal and a second input for the program/read precharge delay signal, a plurality of inverters having their inputs connected in series to the output of the NAND gate, a NOR gate having a first input for the program/read precharge signal and a second input for the program/read precharge delay signal, and an inverter having its input coupled to the output of the NOR gate,
wherein the first input and the second input are the program/read precharge signal and the program/read precharge delay signal, the output from the first to third inverters coupled to the NAND gate is the program/read precharge signal for the block word line, and the output from the fourth inverter coupled to the NOR gate is the program/read precharge signal for group access.

9. The memory of claim 5, wherein the group access signal generation circuit comprises:
a high voltage switch having a first input for a first clock, a second input for a second clock, a third input for the program/read precharge signal for group access, a fourth input for the high voltage, and an output for the group access signal;
a discharge NMOS transistor having its drain coupled to the output, its source grounded, and its control gate coupled to the third input; and
a first inverter having its input coupled to the third input, and a second inverter having its input coupled to the output of the first inverter, and its output coupled to the control gate.

10. The memory of claim 5, wherein the discharge circuit comprises a discharge NMOS transistor having its drain coupled to the block word line, its source grounded, and its control gate coupled to the precharge control circuit.

11. The memory of claim 5, wherein the precharge circuit comprises a precharge NMOS transistor having its drain coupled to the high voltage, its source coupled to the block word line, and its control gate coupled to the output of the group access signal generation circuit, a second NMOS transistor having its control gate and source coupled to the block word line, and a first NMOS transistor having its control gate and source coupled to a drain of the second NMOS transistor, and its drain coupled to the high voltage.

12. The memory of claim 5, wherein the precharge control circuit comprises:
the group access signal generation circuit;
a first NAND gate having a first input for the program/read precharge signal for the block word line, a second input coupled to the second output of a second NAND gate for receiving the block select address signal, and a first output coupled to a source of a separating NMOS transistor for the separating switch;
an inverter having its input coupled to the first output of the first NAND gate, and its output coupled to the control gate of the discharge NMOS transistor in the discharge circuit; and
the separating NMOS transistor having its control gate connected to receive the precharge signal, its drain coupled to the block word line, and its source coupled to the first output of the first NAND gate.

* * * * *